United States Patent
Cheon

(10) Patent No.: US 9,208,843 B2
(45) Date of Patent: Dec. 8, 2015

(54) INTERNAL ADDRESS GENERATION CIRCUITS

(71) Applicant: SK hynix Inc., Icheon-si Gyeonggi-do (KR)

(72) Inventor: Kwonsu Cheon, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 105 days.

(21) Appl. No.: 14/175,734

(22) Filed: Feb. 7, 2014

(65) Prior Publication Data

US 2015/0228319 A1 Aug. 13, 2015

(51) Int. Cl.
*G11C 8/10* (2006.01)
*G11C 8/18* (2006.01)

(52) U.S. Cl.
CPC ... *G11C 8/18* (2013.01); *G11C 8/10* (2013.01)

(58) Field of Classification Search
CPC .................................................... G11C 13/004
USPC ........................................................ 365/148
See application file for complete search history.

(56) References Cited

U.S. PATENT DOCUMENTS

| | | | |
|---|---|---|---|
| 2007/0268737 A1* | 11/2007 | Hidaka | 365/148 |
| 2008/0316802 A1* | 12/2008 | Happ et al. | 365/163 |
| 2009/0248994 A1 | 10/2009 | Zheng et al. | |
| 2009/0268538 A1* | 10/2009 | Fukushima | 365/208 |
| 2010/0208521 A1* | 8/2010 | Kim et al. | 365/185.09 |
| 2015/0103597 A1* | 4/2015 | PARK et al. | 365/185.03 |

FOREIGN PATENT DOCUMENTS

KR 1020110078737 A 7/2011

* cited by examiner

*Primary Examiner* — Hoai V Ho
*Assistant Examiner* — Min Huang
(74) *Attorney, Agent, or Firm* — William Park & Associates Ltd.

(57) ABSTRACT

Internal address generation circuits are provided. The internal address generation circuit includes an aging detector and an address decoder. The aging detector generates an aging signal enabled when the number of times that an internal command signal for accessing memory cells is inputted is equal to or more than a reference number. The address decoder decodes an address signal in response to the aging signal to generate an internal address signal.

19 Claims, 9 Drawing Sheets

FIG.4

| A3 | A2 | A1 | XAGE="L" ⇒ SA3=A3 | XAGE="H" ⇒ SA3B=A3 |
|---|---|---|---|---|
| L | L | L | IADD<1> = "H" | IADD<5> = "H" |
| L | L | H | IADD<2> = "H" | IADD<6> = "H" |
| L | H | L | IADD<3> = "H" | IADD<7> = "H" |
| L | H | H | IADD<4> = "H" | IADD<8> = "H" |
| H | L | L | IADD<5> = "H" | IADD<1> = "H" |
| H | L | H | IADD<6> = "H" | IADD<2> = "H" |
| H | H | L | IADD<7> = "H" | IADD<3> = "H" |
| H | H | H | IADD<8> = "H" | IADD<4> = "H" |

FIG.7

| A3 | A2 | A1 | XAGE1="L" ⇒ SA3=A3<br>XAGE2="L" ⇒ SA2=A2 | XAGE1="H" ⇒ SA3=A3B<br>XAGE2="L" ⇒ SA2=A2 | XAGE1="H" ⇒ SA3=A3B<br>XAGE2="H" ⇒ SA2=A2B |
|---|---|---|---|---|---|
| L | L | L | IADD<1> = "H" | IADD<5> = "H" | IADD<7> = "H" |
| L | L | H | IADD<2> = "H" | IADD<6> = "H" | IADD<8> = "H" |
| L | H | L | IADD<3> = "H" | IADD<7> = "H" | IADD<5> = "H" |
| L | H | H | IADD<4> = "H" | IADD<8> = "H" | IADD<6> = "H" |
| H | L | L | IADD<5> = "H" | IADD<1> = "H" | IADD<3> = "H" |
| H | L | H | IADD<6> = "H" | IADD<2> = "H" | IADD<4> = "H" |
| H | H | L | IADD<7> = "H" | IADD<3> = "H" | IADD<1> = "H" |
| H | H | H | IADD<8> = "H" | IADD<4> = "H" | IADD<2> = "H" |

INTERNAL ADDRESS GENERATION CIRCUITS

BACKGROUND

1. Technical Field

Embodiments of the present disclosure generally relate to semiconductor integrated circuits and, more particularly, to internal address generation circuits.

2. Related Art

Semiconductor devices, for example, dynamic random access memory (DRAM) devices may have row address paths, column address paths and data paths. The row address path may be created during an operation for selecting one of the word lines using a row address signal supplied from an external device and for amplifying the data stored in at least one memory cell connected to the selected word line using at least one sense amplifier, and the column address path may be created during an operation for selecting one of a plurality of output enable signals using a column address signal supplied from the external device. Further, the data path may be created during an operation for transmitting data on bit lines to an external device through input/output (I/O) lines, the sense amplifiers and data output buffers.

The row address path may be created by a plurality of internal row address signals, one of which is selectively enabled by decoding the row address signal to select one of the word lines, and the column address path may be created by a plurality of internal column address signals, one of which is selectively enabled by decoding the column address signal to select one of the output enable signals.

The semiconductor device may execute an operation for creating the row address path including an active operation and a refresh operation and an operation for creating the column address path including a read operation and a write operation. The semiconductor device may include an internal address generation circuit for generating internal address signals to execute the operations for creating the row address path and the column address path. The internal address signals generated from the internal address generation circuit may include an internal row address signal and an internal column address signal.

SUMMARY

Various embodiments are directed to internal address generation circuits.

According to some embodiments, an internal address generation circuit includes an aging detector and an address decoder. The aging detector generates an aging signal enabled when the number of times that an internal command signal for accessing memory cells is inputted is equal to or more than a reference number. The address decoder decodes an address signal in response to the aging signal to generate an internal address signal.

According to further embodiments, an internal address generation circuit includes a first aging detector suitable for generating a first aging signal enabled when the number of times that an internal command signal for accessing memory cells is inputted is equal to or more than a first reference number, a second aging detector suitable for generating a second aging signal enabled when the number of times that the internal command signal is inputted is equal to or more than a second reference number, and an address decoder suitable for decoding an address signal in response to the first and second aging signals to generate an internal address signal.

According to further embodiments, an internal address generation circuit includes a first aging detector suitable for generating a first aging signal enabled when the number of times that a first internal command signal for accessing a row address path of a memory cell is inputted is equal to or more than a first reference number, a second aging detector suitable for generating a second aging signal enabled when the number of times that a second internal command signal for accessing a column address path of the memory cell is inputted is equal to or more than a second reference number, a first address decoder suitable for decoding an address signal in response to the first aging signal to generate an internal row address signal, and a second address decoder suitable for decoding the address signal in response to the second aging signal to generate an internal column address signal.

According to an embodiment, an aging detector includes: a transistor suitable for receiving a voltage supply at a source thereof, receive an aging detection off signal at a gate thereof, and electrically coupled in common with a first and second resistive elements with a drain thereof; the first and second resistive elements coupled in parallel between the drain of the transistor and a level set unit; a first node coupled in common with a first signal transmitter, the level set unit, and a discharging element; and a second node coupled in common with a second signal transmitter, a discharge prevention unit, and the level set unit, wherein the first signal transmitter is suitable for generating an aging signal when the number of times that an internal command signal for accessing memory cells is inputted is equal to or more than a reference number.

According to an embodiment, a system includes: a processor; a controller suitable for receiving an internal command signal for accessing memory cells and a data from the processor; and a memory controller suitable for receiving the internal command signal for accessing memory cells and the data from the controller, wherein the memory controller includes an internal address generation circuit, the circuit comprising: an aging detector suitable for generating an aging signal enabled when the number of times that an internal command signal for accessing memory cells is inputted is equal to or more than a reference number; and an address decoder suitable for decoding an address signal in response to the aging signal to generate an internal address signal.

BRIEF DESCRIPTION OF THE DRAWINGS

Embodiments of the present invention will become more apparent in view of the attached drawings and accompanying detailed description, in which:

FIG. 4 is a logic table illustrating an operation of the internal address generation circuit shown in FIGS. 1, 2 and 3;

FIG. 7 is a logic table illustrating an operation of the internal address generation circuit shown in FIGS. 5 and 6.

DETAILED DESCRIPTION

Various embodiments of the present invention will be described hereinafter with reference to the accompanying drawings. However, the embodiments described herein are for illustrative purposes only and are not intended to limit the scope of the present invention.

Figure 1:
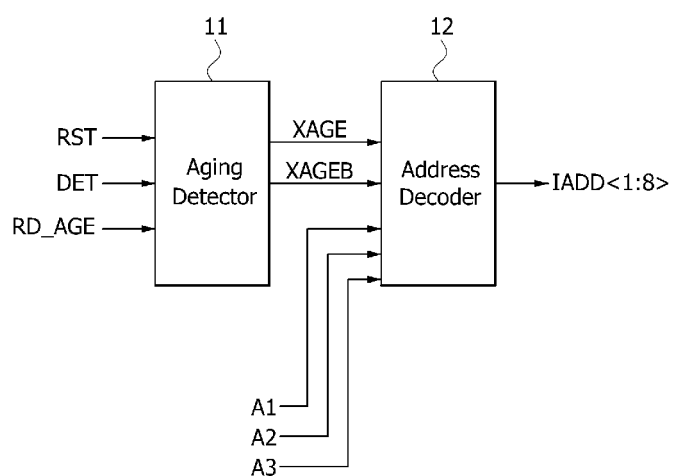
FIG. 1 is a block diagram illustrating an internal address generation circuit according to an embodiment of the present invention.

Referring to FIG. 1, an internal address generation circuit according to an embodiment may include an aging detector 11 and an address decoder 12. The aging detector 11 may receive a reset signal RST, a detection start signal DET and a read control signal RD_AGE to generate an aging signal XAGE and a complementary aging signal XAGEB that include information on whether the number of times that an internal command signal (not shown) for accessing memory cells is inputted is more than a reference number. The aging detector 11 may generate the aging signal XAGE and the complementary aging signal XAGEB which are enabled when the number of times that an internal command signal (not shown) for accessing memory cells is inputted is more than the reference number. The address decoder 12 may decode first to third address signals A1, A2 and A3 in response to the aging signal XAGE and the complementary aging signal XAGEB to generate first to eighth internal address signals IADD<1:8>. The address decoder 12 may decode the first to third address signals A1, A2 and A3 to enable one of the first to eighth internal address signals IADD<1:8>, and the enabled signal of the first to eighth internal address signals IADD<1:8> may be different according to a level combination of the aging signal XAGE and the complementary aging signal XAGEB.

Figure 2:
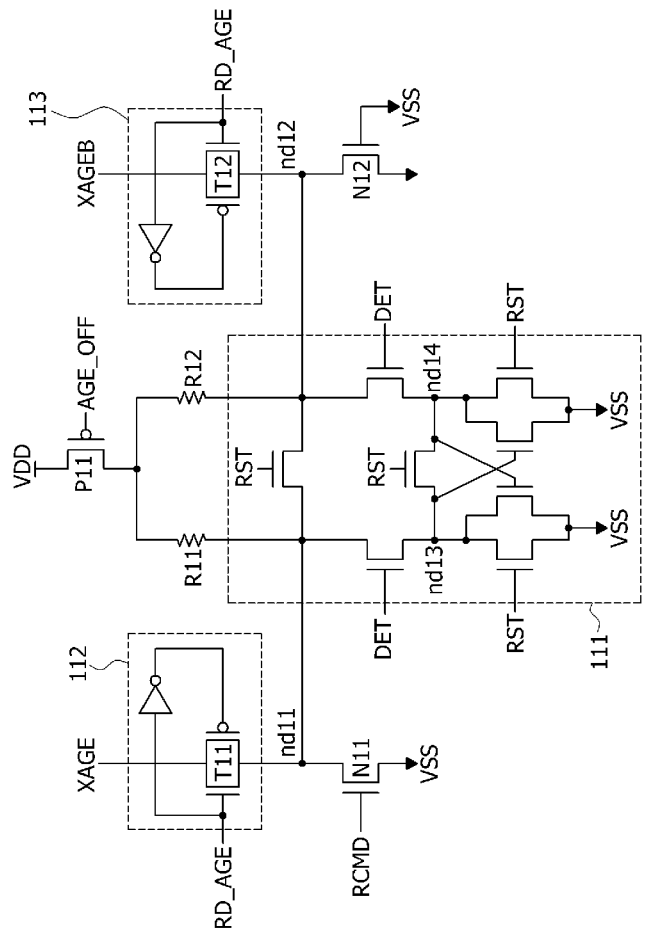
FIG. 2 is a circuit diagram illustrating an aging detector included in the internal address generation circuit of FIG. 1.

Referring to FIG. 2, the aging detector 11 may include a level set unit 111, a PMOS transistor P11, NMOS transistors N11 and N12, a first signal transmitter 112 and a second signal transmitter 113. When the reset signal RST having a logic "high" level (i.e., high voltage level) is inputted to the aging detector 11, the level set unit 111 may equalize voltage levels of nodes nd11 and nd12 and may drive nodes nd13 and nd14 to have a ground voltage VSS. The level set unit 111 may electrically connect the nodes nd11 and nd12 to the nodes nd13 and nd14, respectively, to create current paths when the detection start signal DET having a logic "high" level is inputted thereto and may set logic levels of the nodes nd11 and nd12 according to resistance values of resistive elements R11 and R12. The PMOS transistor P11 may receive an aging detection off signal AGE_OFF to supply charges to the nodes nd11 and nd12 through the resistive elements R11 and R12. The PMOS transistor P11 being coupled between voltage supply VDD and resistive elements R11 and R12. The aging detection off signal AGE_OFF may have a logic "low" level (i.e., low voltage level) while an aging detection operation is executed and may have a logic "high" level if the aging detection operation terminates. The NMOS transistor N11 may be turned on to drain charges on the node nd11 when an internal row command signal RCMD is inputted thereto, or more generally, a discharging element which may include the NMOS transistor N11 may be turned on to drain charges on the node nd11 when an internal command signal (i.e., internal row command signal RCMD and a like) is inputted thereto. The NMOS transistor N11 being coupled between node nd11 and ground voltage VSS terminal. The internal row command signal RCMD may be generated to have a logic "high" level in order to access a row address path of memory cells.

The resistive element or aging resistive element R11 may be set to have a resistance value which is higher than that of the resistive element R12 in an initial state and may act as an aging resistor whose resistance value is reduced whenever the NMOS transistor N11 is turned on. The NMOS transistor N12 may be coupled between the node nd12 and a ground voltage VSS terminal, and a gate of the NMOS transistor N12 is grounded. Thus, the NMOS transistor N12 may be turned off to prevent charges of the node nd12 from being drained to the ground voltage VSS terminal. In other words, a discharge prevention element which may include, for example, a NMOS transistor N12 may act to prevent charges of the node nd12 from being drained to the ground voltage VSS terminal. Even though the NMOS transistor N11 is turned on in response to the internal row command signal RCMD, the resistive element R12 may maintain a constant resistance value to act as a reference resistor or reference resistive element whose resistance value is compared with a resistance value of the resistive element R11. The first signal transmitter 112 may output a signal of the node nd11 as the aging signal XAGE when the read control signal RD_AGE having a logic "high" level is inputted thereto. The first signal transmitter may include a transfer gate T11 for receiving the read control signal RD_AGE. The second signal transmitter 113 may output a signal of the node nd12 as the complementary aging signal XAGEB when the read control signal RD_AGE having a logic "high" level is inputted thereto. The second transmitter may include a transfer gate T12 for receiving the read control signal RD_AGE. The reset signal RST, the detection start signal DET and the read control signal RD_AGE may be sequentially enabled to have a logic "high" level to generate the aging signal XAGE and the complementary aging signal XAGEB while an aging detection operation is executed.

According to the aging detector 11 having the aforementioned configuration, a resistance value of the resistive element R11 may be varied according to the number of times that the internal row command signal RCMD is inputted to the aging detector 11 while the aging detection off signal AGE_OFF having a logic "low" level is inputted to execute an aging detection operation. A resistance value of the resistive element R11 may be greater than that of the resistive element R12 when the number of times that internal row command signal RCMD is inputted is less than a reference number, and a resistance value of the resistive element R11 may be less than that of the resistive element R12 when the number of times that internal row command signal RCMD is inputted is greater than the reference number. Subsequently, if the reset signal RST, the detection start signal DET and the read control signal RD_AGE are sequentially enabled to have a logic "high" level, the aging detector 11 may set levels of the aging signal XAGE and the complementary aging signal XAGEB. Since a resistance value of the resistive element R11 is greater than that of the resistive element R12 when the number of times that the internal row command signal RCMD is inputted is less than the reference number, a level of the node nd11 may be set to have a logic "low" level and a level of the node nd12 may be set to have a logic "high" level. Thus, the aging detector 11 may output the aging signal XAGE having a logic "low" level and the complementary aging signal XAGEB having a logic "high" level. In contrast, since a resistance value of the resistive element R11 is less than that of the resistive element R12 when the number of times that the internal row command signal RCMD is inputted is greater than the reference number, a level of the node nd11 may be set to have a logic "high" level and a level of the node nd12 may be set to have a logic "low" level. Thus, the aging detector 11 may output the aging signal XAGE having a logic "high" level and the complementary aging signal XAGEB having a logic "low" level.

Figure 3:
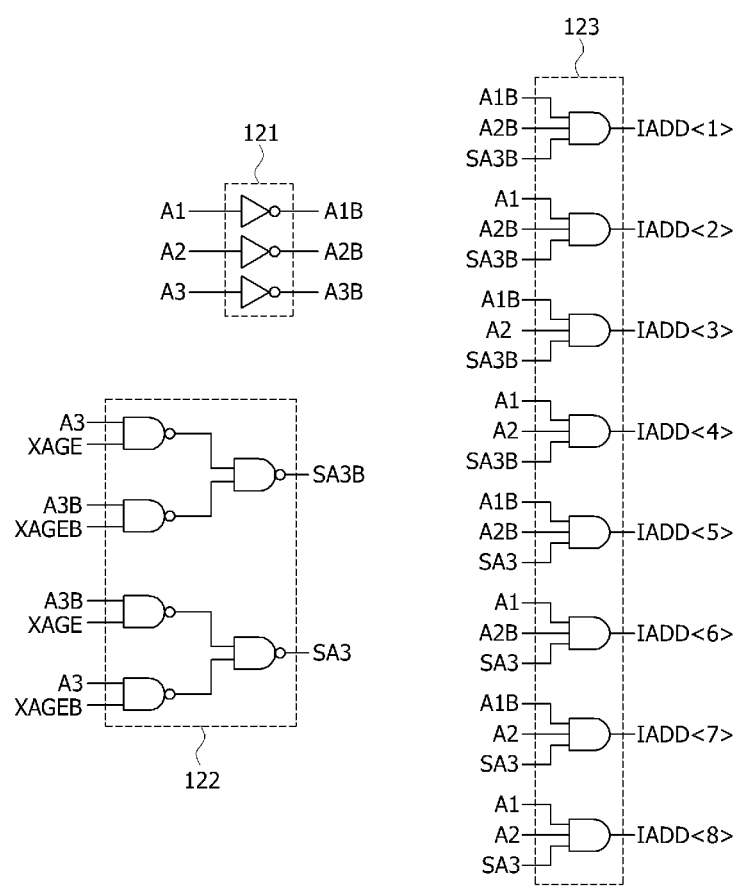
FIG. 3 is a circuit diagram illustrating an address decoder included in the internal address generation circuit of FIG. 1.

Referring to FIG. 3, the address decoder 12 may include an inverting unit 121, a selective inverting unit 122 and an address combining unit 123. The inverting unit 121 may invert the first to third address signals A1, A2 and A3 to generate first to third complementary address signals A1B, A2B and A3B. The selective inverting unit 122 may output the third address signal A3 and the third complementary address signal A3B as a third selective address signal SA3 and a third complementary selective address signal SA3B in response to the aging signal XAGE and the complementary aging signal XAGEB. For example, when the aging signal XAGE has a logic "low" level and the complementary aging signal XAGEB has a logic "high" level, the selective inverting unit 122 may output the third address signal A3 as the third selective address signal SA3 and may output the third complementary address signal A3B as the third complementary selective address signal SA3B. Alternatively, when the aging signal XAGE has a logic "high" level and the complementary aging signal XAGEB has a logic "low" level, the selective inverting unit 122 may output the third address signal A3 as the third complementary selective address signal SA3B and may output the third complementary address signal A3B as the third selective address signal SA3. The address combining unit 123 may decode the first and second address signals A1 and A2, the first and second complementary address signals A1B and A2B, the third selective address signal SA3, and the third complementary selective address signal SA3B to generate the first to eighth internal address signals IADD<1:8>.

An operation of the internal address generation circuit illustrated in FIGS. 1, 2 and 3 will be described hereinafter with reference to FIG. 4 in conjunction with an example in which the number of times that the internal row command signal RCMD is inputted is less than the reference number and an example in which the number of times that the internal row command signal RCMD is inputted is equal to or more than the reference number.

When the number of times that the internal row command signal RCMD is inputted into the NMOS transistor N11 (see FIG. 2) is less than a reference number, the aging signal XAGE may be generated to have a logic "low" level and the complementary aging signal XAGEB may be generated to have a logic "high" level. Thus, the third address signal A3 may be outputted as the third selective address signal SA3 and the third complementary address signal A3B may be outputted as the third complementary selective address signal SA3B. Accordingly, as illustrated in FIG. 4, the first to eighth internal address signals IADD<1:8> may be sequentially enabled to have a logic "high" level whenever a level combination of the first to third address signals A1, A2 and A3 is increased by one bit from a level combination of "L,L,L" to a logic combination of "H,H,H". For example, only the third internal address signal IADD<3> among the first to eighth internal address signals IADD<1:8> may be enabled to have a logic "high" level when a level combination of the first to third address signals A1, A2 and A3 is "L,H,L", respectively, and only the seventh internal address signal IADD<7> among the first to eighth internal address signals IADD<1:8> may be enabled to have a logic "high" level when a level combination of the first to third address signals A1, A2 and A3 is "H,H,L", respectively.

Additionally, when the number of times that the internal row command signal RCMD into the NMOS transistor N11 (see FIG. 2) is inputted is equal to or more than a reference number, the aging signal XAGE may be generated to have a logic "high" level and the complementary aging signal XAGEB may be generated to have a logic "low" level. Thus, the third address signal A3 may be outputted as the third complementary selective address signal SA3B and the third complementary address signal A3B may be outputted as the third selective address signal SA3. Accordingly, as illustrated in FIG. 4, the fifth, sixth, seventh, eighth, first, second, third and fourth internal address signals IADD<5>, IADD<6>, IADD<7>, IADD<8>, IADD<1>, IADD<2>, IADD<3> and IADD<4> may be sequentially enabled to have a logic "high" level whenever a level combination of the first to third address signals A1, A2 and A3 is increased by one bit from a level combination of "L,L,L" to a logic combination of "H,H,H". For example, only the third internal address signal IADD<3> among the first to eighth internal address signals IADD<1:8> may be enabled to have a logic "high" level when a level combination of the first to third address signals A3, A2 and A1 is "L,H,L", respectively, and only the seventh internal address signal IADD<7> among the first to eighth internal address signals IADD<1:8> may be enabled to have a logic "high" level when a level combination of the first to third address signals A3, A2 and A1 is "H,H,L" respectively.

As described above, if the number of times that the internal row command signal RCMD is inputted is equal to or more than the reference number, actual addresses of selected memory cells may be changed even though a level combination of the first to third address signals A1, A2 and A3 is not changed. Thus, stress applied to the memory cells which are frequently accessed may be relieved. For example, even though the first to third address signals A1, A2 and A3 continuously maintain a level combination of "L,H,L", only the third internal address signal IADD<3> may be enabled to have a logic "high" level when the number of times that the internal row command signal RCMD is inputted is less than the reference number and only the seventh internal address signal IADD<7> may be enabled to have a logic "high" level when the number of times that the internal row command signal RCMD is inputted is equal to or more than the reference number.

Figure 5:
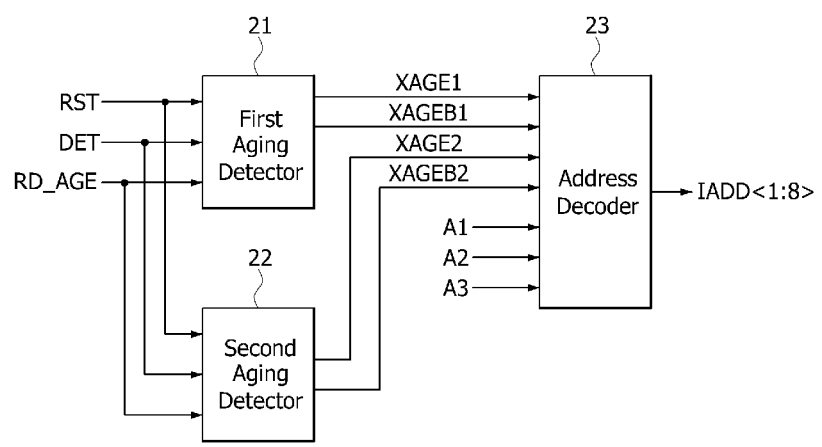
FIG. 5 is a block diagram illustrating an internal address generation circuit according to an embodiment of the present invention.

Referring to FIG. 5, an internal address generation circuit according to an embodiment may include a first aging detector 21, a second aging detector 22 and an address decoder 23. The first aging detector 21 may receive a reset signal RST, a detection start signal DET and a read control signal RD_AGE to generate a first aging signal XAGE1 and a first complementary aging signal XAGEB1 that include information on whether the number of times that an internal command signal (not shown) for accessing memory cells is inputted is less than a first reference number. Further, the second aging detector 22 may receive the reset signal RST, the detection start signal DET and the read control signal RD_AGE to generate a second aging signal XAGE2 and a second complementary aging signal XAGEB2 that include information on whether the number of times that the internal command signal for accessing memory cells is inputted is less than a second reference number. The first aging signal XAGE1 and the first complementary aging signal XAGEB1 may be enabled when the number of times that the internal command signal for accessing memory cells is inputted is more than the first reference number, and the second aging signal XAGE2 and the second complementary aging signal XAGEB2 may be enabled when the number of times that the internal command signal for accessing memory cells is inputted is more than the second reference number. In the present embodiments, the second reference number may be greater than the first reference number. For this configuration, an aging resistor (for example, see resistive element R11 of FIG. 2) included in the second aging detector 22 may be set to have a resistance value which is greater than that of an aging resistor included in the first aging detector 21.

The address decoder 23 may decode first to third address signals A1, A2 and A3 in response to the first and second aging signal XAGE1 and XAGE2 and the first and second complementary aging signals XAGEB1 and XAGEB2 to generate first to eighth internal address signals IADD<1:8>. The address decoder 23 may decode the first to third address signals A1, A2 and A3 to enable one of the first to eighth internal address signals IADD<1:8>, and the enabled signal of the first to eighth internal address signals IADD<1:8> may be different according to a level combination of the first and second aging signal XAGE1 and XAGE2 and the first and second complementary aging signals XAGEB1 and XAGEB2.

Each of the first and second aging detectors 21 and 22 may be realized to have substantially the same configuration as the aging detector 11 illustrated in FIG. 2. Thus, a detailed configuration and operation of the first and second aging detectors 21 and 22 will be omitted hereinafter.

Figure 6:
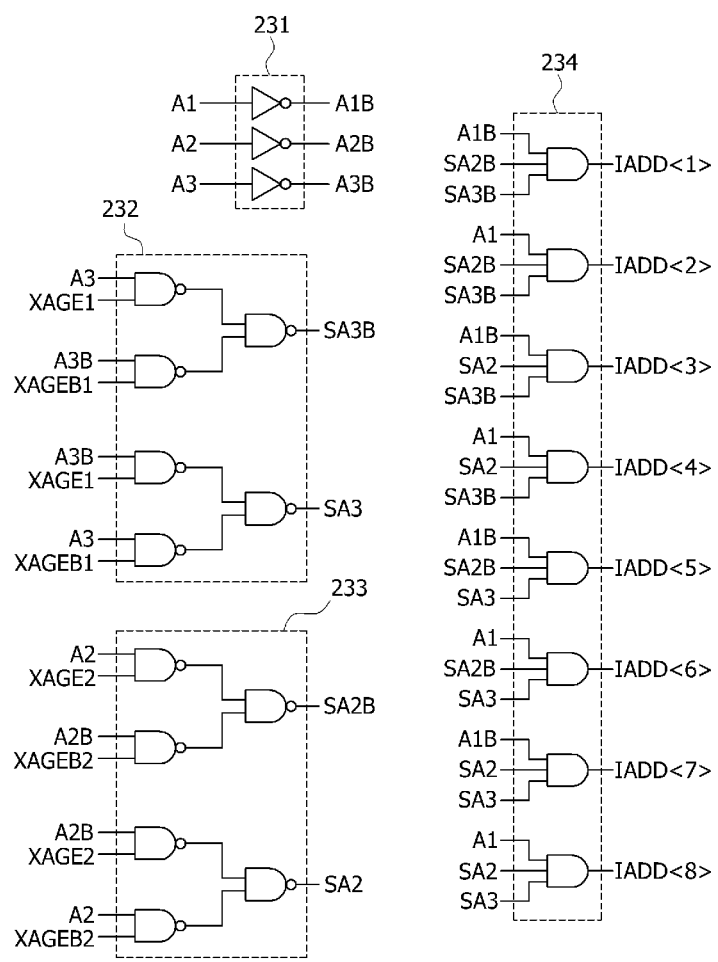
FIG. 6 is a circuit diagram illustrating an address decoder included in the internal address generation circuit of FIG. 5.

Referring to FIG. 6, the address decoder 23 may include an inverting unit 231, a first selective inverting unit 232, a second selective inverting unit 233 and an address combining unit 234. The inverting unit 231 may invert the first to third address signals A1, A2 and A3 to generate first to third complementary address signals A1B, A2B and A3B. The first selective inverting unit 232 may output the third address signal A3 and the third complementary address signal A3B as a third selective address signal SA3 and a third complementary selective address signal SA3B in response to the first aging signal XAGE1 and the first complementary aging signal XAGEB1. For example, when the first aging signal XAGE1 has a logic "low" level and the first complementary aging signal XAGEB1 has a logic "high" level, the first selective inverting unit 232 may output the third address signal A3 as the third selective address signal SA3 and may output the third complementary address signal A3B as the third complementary selective address signal SA3B. Alternatively, when the first aging signal XAGE1 has a logic "high" level and the first complementary aging signal XAGEB1 has a logic "low" level, the first selective inverting unit 232 may output the third address signal A3 as the third complementary selective address signal SA3B and may output the third complementary address signal A3B as the third selective address signal SA3.

The second selective inverting unit 233 may output the second address signal A2 and the second complementary address signal A2B as a second selective address signal SA2 and a second complementary selective address signal SA2B in response to the second aging signal XAGE2 and the second complementary aging signal XAGEB2. For example, when the second aging signal XAGE2 has a logic "low" level and the second complementary aging signal XAGEB2 has a logic "high" level, the second selective inverting unit 233 may output the second address signal A2 as the second selective address signal SA2 and may output the second complementary address signal A2B as the second complementary selective address signal SA2B. Alternatively, when the second aging signal XAGE2 has a logic "high" level and the second complementary aging signal XAGEB2 has a logic "low" level, the second selective inverting unit 233 may output the second address signal A2 as the second complementary selective address signal SA2B and may output the second complementary address signal A2B as the second selective address signal SA2.

The address combining unit 234 may decode The first address signal A1, the first complementary address signal A1B, the second and third selective address signals SA2 and SA3, and the second and third complementary selective address signals SA2B and SA3B to generate the first to eighth internal address signals IADD<1:8>.

An operation of the internal address generation circuit illustrated in FIGS. 5 and 6 will be described hereinafter with reference to FIG. 7 in conjunction with an example in which the number of times that the internal row command signal RCMD is inputted is less than the first reference number, an example in which the number of times that the internal row command signal RCMD is inputted is equal to or more than the first reference number and less than the second reference number, and an example in which the number of times that the internal row command signal RCMD is inputted is more than the second reference number.

When the number of times that the internal row command signal RCMD is inputted into, for example, the NMOS transistor N11 (see FIG. 2) is less than the first reference number, the first and second aging signals XAGE1 and XAGE2 may be generated to have a logic "low" level and the first and second complementary aging signal XAGEB1 and XAGEB2 may be generated to have a logic "high" level. Thus, the second address signal A2 may be outputted as the second selective address signal SA2, the second complementary address signal A2B may be outputted as the second complementary selective address signal SA2B, the third address signal A3 may be outputted as the third selective address signal SA3, and the third complementary address signal A3B may be outputted as the third complementary selective address signal SA3B. Accordingly, as illustrated in FIG. 7, the first to eighth internal address signals IADD<1:8> may be sequentially enabled to have a logic "high" level whenever a level combination of the first to third address signals A1, A2 and A3 is increased by one bit from a level combination of "L,L,L" to a logic combination of "H,H,H". For example, only the third internal address signal IADD<3> among the first to eighth internal address signals IADD<1:8> may be enabled to have a logic "high" level when a level combination of the first to third address signals A3, A2 and A1 is "L,H,L", respectively, and only the seventh internal address signal IADD<7> among the first to eighth internal address signals IADD<1:8> may be enabled to have a logic "high" level when a level combination of the first to third address signals A3, A2 and A1 is "H,H,L" respectively.

When the number of times that the internal row command signal RCMD is inputted into, for example, the NMOS transistor N11 (see FIG. 2) is equal to or more than the first reference number and less than the second reference number, the first aging signal XAGE1 and the second complementary aging signal XAGEB2 may be generated to have a logic "high" level and the first complementary aging signal XAGEB1 and the second aging signal XAGE2 may be generated to have a logic "low" level. Thus, the second address signal A2 may be outputted as the second selective address signal SA2, the second complementary address signal A2B may be outputted as the second complementary selective address signal SA2B, the third address signal A3 may be outputted as the third complementary selective address signal SA3B, and the third complementary address signal A3B may be outputted as the third selective address signal SA3. Accordingly, as illustrated in FIG. 7, the fifth, sixth, seventh, eighth, first, second, third and fourth internal address signals IADD<5>, IADD<6>, IADD<7>, IADD<8>, IADD<1>, IADD<2>, IADD<3> and IADD<4> may be sequentially enabled to have a logic "high" level whenever a level combination of the first to third address signals A1, A2 and A3 is increased by one bit from a level combination of "L,L,L" to a logic combination of "H,H,H". For example, only the seventh internal address signal IADD<7> among the first to eighth internal address signals IADD<1:8> may be enabled to have a logic "high" level when a level combination of the first to third address signals A3, A2 and A1 is "L,H,L", respectively, and only the third internal address signal IADD<3> among the first to eighth internal address signals IADD<1:8> may be enabled to have a logic "high" level when a level combination of the first to third address signals A3, A2 and A1 is "H,H,L" respectively.

When the number of times that the internal row command signal RCMD is inputted into, for example, the NMOS transistor N11 (see FIG. 2) is more than the second reference number, the first and second aging signals XAGE1 and XAGE2 may be generated to have a logic "high" level and the first and second complementary aging signal XAGEB1 and XAGEB2 may be generated to have a logic "low" level. Thus, the second address signal A2 may be outputted as the second complementary selective address signal SA2B, the second complementary address signal A2B may be outputted as the second selective address signal SA2, the third address signal A3 may be outputted as the third complementary selective address signal SA3B, and the third complementary address signal A3B may be outputted as the third selective address signal SA3. Accordingly, as illustrated in FIG. 7, the seventh, eighth, fifth, sixth, third, fourth, first and second internal address signals IADD<7>, IADD<8>, IADD<5>, IADD<6>, IADD<3>, IADD<4>, IADD<1> and IADD<2> may be sequentially enabled to have a logic "high" level whenever a level combination of the first to third address signals A1, A2 and A3 is increased by one bit from a level combination of "L,L,L" to a logic combination of "H,H,H". For example, only the fifth internal address signal IADD<5> among the first to eighth internal address signals IADD<1:8> may be enabled to have a logic "high" level when a level combination of the first to third address signals A3, A2 and A1 is "L,H,L", respectively, and only the first internal address signal IADD<1> among the first to eighth internal address signals IADD<1:8> may be enabled to have a logic "high" level when a level combination of the first to third address signals A3, A2 and A1 is "H,H,L" respectively.

As described above, addresses of selected memory cells may be changed if the number of times that the internal row command signal RCMD is inputted increases to be equal to or more than the first reference number, and the addresses of the selected memory cells may also be changed if the number of times that the internal row command signal RCMD is inputted increases to be equal to or more than the second reference number. Thus, stress applied to the memory cells which are frequently accessed may be relieved. For example, even though the first to third address signals A1, A2 and A3 continuously maintain a level combination of "L,H,L", only the third internal address signal IADD<3> may be enabled to have a logic "high" level if the number of times that the internal row command signal RCMD is inputted is less than the first number, only the seventh internal address signal IADD<7> may be enabled to have a logic "high" level if the number of times that the internal row command signal RCMD is inputted is equal to or more than the first reference number and less than the second reference number, and only the fifth internal address signal IADD<5> may be enabled to have a logic "high" level if the number of times that the internal row command signal RCMD is inputted is more than the second reference number.

Figure 8:
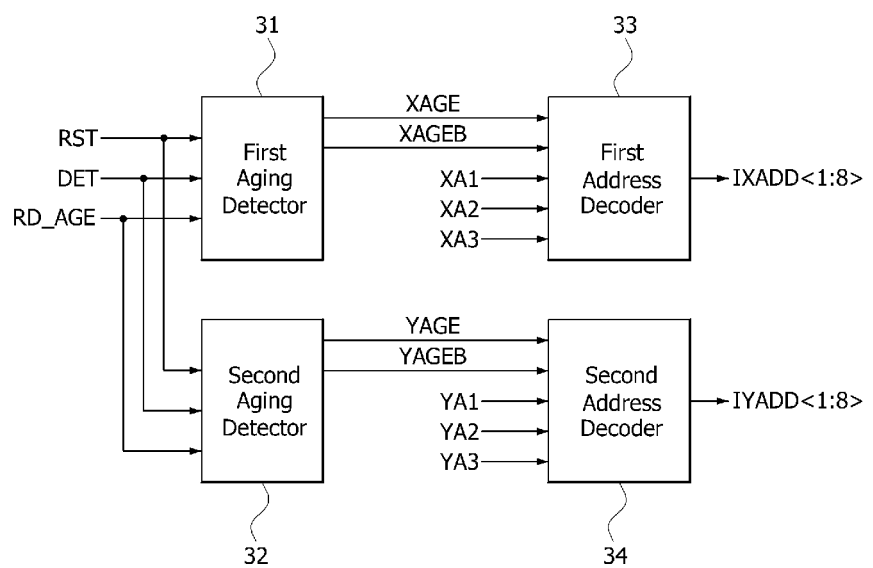
FIG. 8 is a block diagram illustrating an internal address generation circuit according to other embodiments of the present invention.

Referring to FIG. 8, an internal address generation circuit according to other embodiments may include a first aging detector 31, a second aging detector 32, a first address decoder 33 and a second address decoder 34. The first aging detector 31 may receive a reset signal RST, a detection start signal DET and a read control signal RD_AGE to generate a first aging signal XAGE and a first complementary aging signal XAGEB which are enabled when the number of times that a first internal command signal (not shown) for accessing a row address path of memory cells is inputted is equal to or more than a first reference number. The second aging detector 32 may receive the reset signal RST, the detection start signal DET and the read control signal RD_AGE to generate a second aging signal YAGE and a second complementary aging signal YAGEB which are enabled when the number of times that a second internal command signal (not shown) for accessing a column address path of the memory cells is inputted is equal to or more than a second reference number. The first internal command signal may be a command signal for executing an active operation or a refresh operation, and the second internal command signal may be a command signal for executing a read operation or a write operation. The first reference number may be equal to or different from the second reference number according to the embodiments.

The first address decoder 33 may decode the first to third address signals XA1, XA2 and XA3 in response to the first aging signal XAGE and the first complementary aging signal XAGEB to generate first to eighth internal row address signals IXADD<1:8>. The first address decoder 33 may decode the first to third address signals XA1, XA2 and XA3 to enable one of the first to eighth internal row address signals IXADD<1:8>, and the enabled signal of the first to eighth internal row address signals IXADD<1:8> may be different according to a level combination of the first aging signal XAGE and the first complementary aging signal XAGEB.

The second address decoder 34 may decode the first to third address signals YA1, YA2 and YA3 in response to the second aging signal YAGE and the second complementary aging signal YAGEB to generate first to eighth internal column address signals IYADD<1:8>. The second address decoder 34 may decode the first to third address signals YA1, YA2 and YA3 to enable one of the first to eighth internal column address signals IYADD<1:8>, and the enabled signal of the first to eighth internal column address signals IYADD<1:8> may be different according to a level combination of the second aging signal YAGE and the second complementary aging signal YAGEB.

Each of the first and second aging detectors 31 and 32 may be realized to have substantially the same configuration as the aging detector 11 illustrated in FIG. 2. Thus, a detailed configuration and operation of the first and second aging detectors 31 and 32 will be omitted hereinafter. Each of the first and second address decoders 33 and 34 may be realized to have substantially the same configuration as the address decoder 12 illustrated in FIG. 3. Thus, a detailed configuration and operation of the first and second address decoders 33 and 34 will be omitted hereinafter.

As described above, if the number of times that the first internal command signal is inputted is equal to or more than the first reference number, actual addresses of selected memory cells may be changed even though a level combination of the first to third address signals A1, A2 and A3 is not changed (i.e., XA1, XA1, XA2, XA3, YA1, YA2, and YA3). Thus, stress applied to the memory cells which are frequently accessed may be relieved. Further, if the number of times that the second internal command signal is inputted is equal to or more than the second reference number, actual addresses of selected memory cells may also be changed even though a level combination of the first to third address signals A1, A2 and A3 is not changed (i.e., XA1, XA2, XA3, YA1, YA2, and YA3). Thus, stress applied to the memory cells which are frequently accessed may be relieved.

Figure 9:
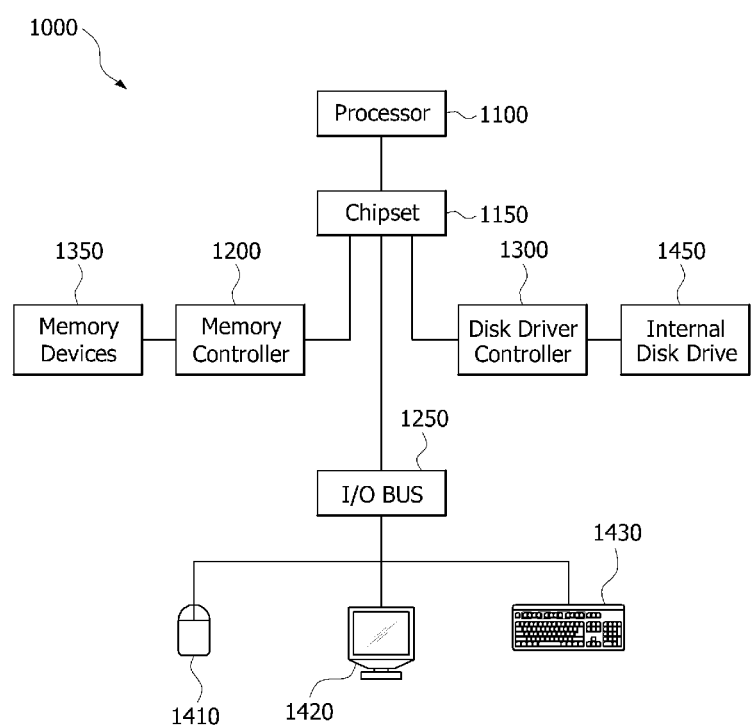
FIG. 9 illustrates a block diagram of a system employing a memory controller circuit in accordance with embodiments of the present invention.

The internal address generation circuits discussed above are particular useful in the design of memory devices, processors, and computer systems. For example, referring to FIG. 9, a block diagram of a system employing a memory controller in accordance with embodiments of the invention is illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one internal address generation circuit including an aging detector and an address decoder as discussed above with reference to FIGS. 1-8. The aging detector capable of generating an aging signal enabled when the number of times that an internal command signal for accessing memory cells is inputted is equal to or more than a reference number. The address decoder capable of decoding an address signal in response to the aging signal to generate an internal address signal. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may correspond to or include the internal address generation circuits as discussed above with reference to FIGS. 1-8, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 9 is merely one example of a system employing a memory controller having an aging detector and an address decoder. In alternate embodiments, such as cellular phones or digital cameras, the components may differ from the embodiments shown in FIG. 9.

What is claimed is:

1. An internal address generation circuit, the circuit comprising:
   an aging detector suitable for generating an aging signal enabled when the number of times that an internal command signal for accessing memory cells is inputted is equal to or more than a reference number; and
   an address decoder suitable for decoding an address signal in response to the aging signal to generate an internal address signal, wherein the internal address signal includes a first internal address signal and a second internal address signal, wherein when the aging signal is disabled, the address decoder decodes the address signal having a first level combination to generate the first internal address signal enabled and decodes the address signal having a second level combination to generate the second internal address signal enabled, and wherein when the aging signal is enabled, the address decoder decodes the address signal having the first level combination to generate the second internal address signal enabled and decodes the address signal having the second level combination to generate the first internal address signal enabled.

2. The circuit of claim 1,
   wherein the aging detector includes a reference resistive element and an aging resistive element; and
   wherein a resistance value of the aging resistive element is greater than that of the reference resistive element when the number of times that the internal command signal is inputted is less than the reference number and a resistance value of the aging resistive element is less than that of the reference resistive element when the number of times that the internal command signal is inputted is equal to or more than the reference number.

3. The circuit of claim 2, wherein the aging detector further includes:
   a first node whose voltage level is determined by a resistance value of the aging resistive element in response to a detection start signal; and
   a second node whose voltage level is determined by a resistance value of the reference resistive element in response to the detection start signal.

4. The circuit of claim 3, wherein the aging detector further includes a discharging element suitable for draining charges of the first node in response to the internal command signal, and a discharge prevention element suitable for preventing charges of the second node from being drained.

5. The circuit of claim 3, wherein the aging detector is suitable for outputting a signal of the first node as the aging signal in response to a read control signal and to output a signal of the second node as a complementary aging signal in response to the read control signal.

6. The circuit of claim 5,
wherein the aging detector is suitable for equalizing voltage levels of the first and second nodes and to initialize a third node and a fourth node, in response to a reset signal; and
wherein the aging detector is suitable for electrically connecting the first and second nodes to the third and fourth nodes, respectively, in response to the detection start signal.

7. An internal address generation circuit, the circuit comprising:
a first aging detector suitable for generating a first aging signal enabled when the number of times that an internal command signal for accessing memory cells is inputted is equal to or more than a first reference number;
a second aging detector suitable for generating a second aging signal enabled when the number of times that the internal command signal is inputted is equal to or more than a second reference number; and
an address decoder suitable for decoding an address signal in response to the first and second aging signals to generate an internal address signal, wherein the internal address signal includes a first internal address signal, a second internal address signal and a third internal address signal, wherein when both the first and second aging signals are disabled, the address decoder decodes the address signal having a first level combination to generate the first internal address signal enabled, decodes the address signal having a second level combination to generate the second internal address signal enabled, and decodes the address signal having a third level combination to generate the third internal address signal enabled, and wherein when the first aging signal is enabled and the second aging signal is disabled, the address decoder decodes the address signal having the first level combination to generate the second internal address signal enabled, decodes the address signal having the second level combination to generate the third internal address signal enabled, and decodes the address signal having the third level combination to generate the first internal address signal enabled.

8. The circuit of claim 7, wherein the second reference number is greater than the first reference number.

9. The circuit of claim 7,
wherein the first aging detector includes a reference resistive element and an aging resistive element; and
wherein a resistance value of the aging resistive element is greater than that of the reference resistive element when the number of times that the internal command signal is inputted is less than the first reference number and a resistance value of the aging resistive element is less than that of the reference resistive element when the number of times that the internal command signal is inputted is equal to or more than the first reference number.

10. The circuit of claim 9, wherein the first aging detector further includes:
a first node whose voltage level is determined by a resistance value of the aging resistive element in response to a detection start signal;
a second node whose voltage level is determined by a resistance value of the reference resistive element in response to the detection start signal;
a discharging element suitable for draining charges of the first node in response to the internal command signal; and
a discharge prevention element suitable for preventing charges of the second node from being drained.

11. The circuit of claim 10, wherein the first aging detector is suitable for outputting a signal of the first node as the first aging signal in response to a read control signal and to output a signal of the second node as a first complementary aging signal in response to the read control signal.

12. The circuit of claim 7,
wherein the second aging detector includes a reference resistive element and an aging resistive element; and
wherein a resistance value of the aging resistive element is greater than that of the reference resistive element when the number of times that the internal command signal is inputted is less than the second reference number and a resistance value of the aging resistive element is less than that of the reference resistive element when the number of times that the internal command signal is inputted is equal to or more than the second reference number.

13. The circuit of claim 7,
wherein when both the first and second aging signals are enabled, the address decoder decodes the address signal having the first level combination to generate the third internal address signal enabled, decodes the address signal having the second level combination to generate the first internal address signal enabled, and decodes the address signal having the third level combination to generate the second internal address signal enabled.

14. An internal address generation circuit, the circuit comprising:
a first aging detector suitable for generating a first aging signal enabled when the number of times that a first internal command signal for accessing a row address path of a memory cell is inputted is equal to or more than a first reference number;
a second aging detector suitable for generating a second aging signal enabled when the number of times that a second internal command signal for accessing a column address path of the memory cell is inputted is equal to or more than a second reference number;
a first address decoder suitable for decoding an address signal in response to the first aging signal to generate an internal row address signal; and
a second address decoder suitable for decoding the address signal in response to the second aging signal to generate an internal column address signal, wherein the internal column address signal includes a first internal column address signal and a second internal column address signal, wherein when the second aging signal is disabled, the second address decoder decodes the address signal having a first level combination to generate the first internal column address signal enabled and decodes the address signal having a second level combination to generate the second internal column address signal enabled, and wherein when the second aging signal is enabled, the second address decoder decodes the address signal having the first level combination to generate the second internal column address signal enabled and decodes the address signal having the second level combination to generate the first internal column address signal enabled, wherein the internal row address signal includes a first internal row address signal and a second internal row address signal, wherein when the first aging signal is disabled, the first address decoder decodes the address signal having a first level combination to generate the first internal row address signal enabled and decodes the address signal having a second level combination to generate the second internal row address signal enabled, and wherein when the first aging signal is enabled, the first address decoder decodes the address signal having the first level combination to generate the second internal row address signal enabled and decodes the address signal having the second level combination to generate the first internal row address signal enabled.

15. The circuit of claim 14,
wherein the first aging detector includes a reference resistive element and an aging resistive element; and
wherein a resistance value of the aging resistive element is greater than that of the reference resistive element when the number of times that the first internal command signal is inputted is less than the first reference number and a resistance value of the aging resistive element is less than that of the reference resistive element when the number of times that the first internal command signal is inputted is equal to or more than the first reference number.

16. The circuit of claim 15, wherein the first aging detector further includes:
a first node whose voltage level is determined by a resistance value of the aging resistive element in response to a detection start signal;
a second node whose voltage level is determined by a resistance value of the reference resistive element in response to the detection start signal;
a discharging element suitable for draining charges of the first node in response to the first internal command signal; and
a discharge prevention element suitable for preventing charges of the second node from being drained.

17. The circuit of claim 16, wherein the first aging detector is suitable for outputting a signal of the first node as the first aging signal in response to a read control signal and to output a signal of the second node as a first complementary aging signal in response to the read control signal.

18. The circuit of claim 14,
wherein the second aging detector includes a reference resistive element and an aging resistive element; and
wherein a resistance value of the aging resistive element is greater than that of the reference resistive element when the number of times that the second internal command signal is inputted is less than the second reference number and a resistance value of the aging resistive element is less than that of the reference resistive element when the number of times that the second internal command signal is inputted is equal to or more than the second reference number.

19. An internal address generation circuit, the circuit comprising:
a first aging detector suitable for generating a first aging signal enabled when the number of times that a first internal command signal for accessing a row address path of a memory cell is inputted is equal to or more than a first reference number;
a second aging detector suitable for generating a second aging signal enabled when the number of times that a second internal command signal for accessing a column address path of the memory cell is inputted is equal to or more than a second reference number;
a first address decoder suitable for decoding an address signal in response to the first aging signal to generate an internal row address signal; and
a second address decoder suitable for decoding the address signal in response to the second aging signal to generate an internal column address signal, wherein the internal column address signal includes a first internal column address signal and a second internal column address signal, wherein when the second aging signal is disabled, the second address decoder decodes the address signal having a first level combination to generate the first internal column address signal enabled and decodes the address signal having a second level combination to generate the second internal column address signal enabled, and wherein when the second aging signal is enabled, the second address decoder decodes the address signal having the first level combination to generate the second internal column address signal enabled and decodes the address signal having the second level combination to generate the first internal column address signal enabled, wherein the internal column address signal includes a first internal column address signal and a second internal column address signal, wherein when the second aging signal is disabled, the second address decoder decodes the address signal having a first level combination to generate the first internal column address signal enabled and decodes the address signal having a second level combination to generate the second internal column address signal enabled, and wherein when the second aging signal is enabled, the second address decoder decodes the address signal having the first level combination to generate the second internal column address signal enabled and decodes the address signal having the second level combination to generate the first internal column address signal enabled.

* * * * *